US009331406B2

(12) United States Patent
Watanabe

(10) Patent No.: US 9,331,406 B2
(45) Date of Patent: May 3, 2016

(54) RECEPTACLE CONNECTOR AND METHOD OF PRODUCING RECEPTACLE CONNECTOR

(71) Applicant: KYOCERA Connector Products Corporation, Kanagawa (JP)

(72) Inventor: Hiroaki Watanabe, Kanagawa (JP)

(73) Assignee: KYOCERA Connector Products Corporation, Yokohama-shi, Kanagawa (JP)

( * ) Notice: Subject to any disclaimer, the term of this patent is extended or adjusted under 35 U.S.C. 154(b) by 0 days.

(21) Appl. No.: 14/538,161

(22) Filed: Nov. 11, 2014

(65) Prior Publication Data

US 2015/0140841 A1 May 21, 2015

(30) Foreign Application Priority Data

Nov. 19, 2013 (JP) ................................. 2013-239003

(51) Int. Cl.
*H05K 1/00* (2006.01)
*H01R 12/71* (2011.01)
*H01R 43/18* (2006.01)
*H01R 12/70* (2011.01)

(52) U.S. Cl.
CPC .......... *H01R 12/716* (2013.01); *H01R 12/7011* (2013.01); *H01R 43/18* (2013.01)

(58) Field of Classification Search
CPC ..... H01R 12/76; H01R 12/7011; H01R 43/18
USPC ............................ 439/74, 357, 345, 626, 660
See application file for complete search history.

(56) References Cited

U.S. PATENT DOCUMENTS 8,845,339 B2 * 9/2014 Ono .................. H01R 12/7052 439/74

FOREIGN PATENT DOCUMENTS

JP 5250450 B 9/2010
JP 2013206771 A 10/2013

* cited by examiner

*Primary Examiner* — Amy Cohen Johnson
*Assistant Examiner* — Milagros Jeancharles
(74) *Attorney, Agent, or Firm* — McCormick, Paulding & Huber LLP

(57) ABSTRACT

A receptacle connector includes a receptacle insulator having an annular outer peripheral wall which defines a fitting recess; receptacle contacts; and a receptacle-side metal fixing member. When a projecting fitting portion of a plug insulator of a plug connector is fitted into the fitting recess, plug contacts of the plug connector come into contact with the receptacle contacts, and the plug connector comes into contact with the receptacle-side metal fixing member. The receptacle-side metal fixing member and the receptacle insulator are integrally formed by insert molding, and the receptacle-side metal fixing member includes a resilient contact portion which is spaced from a surface of the outer peripheral wall on the circumferentially inner side thereof when the resilient contact portion is in a free state.

2 Claims, 9 Drawing Sheets

RECEPTACLE CONNECTOR AND METHOD OF PRODUCING RECEPTACLE CONNECTOR

CROSS REFERENCE TO RELATED APPLICATION

The present invention is related to and claims priority of the following co-pending application, namely, Japanese Patent Application No. 2013-239003 filed on Nov. 19, 2013.

FIELD OF THE INVENTION

The present invention relates to a receptacle connector capable of being connected to and disconnected from a plug connector, and a method of producing such a receptacle connector.

BACKGROUND OF THE INVENTION

Electronic apparatuses and electrical apparatuses such as desktop PCs (personal computers), notebook PCs, mobile phones, smart devices (e.g., smartphones) or tablet PCs usually incorporate a circuit board which contains electronic parts and another circuit board which contains other electronic parts.

The connectors disclosed in Japanese Unexamined Patent Publication No. 2013-206771 and Japanese Patent Publication No. 5,250,450 are for connecting such two circuit boards, and are provided with a receptacle connector mounted on a circuit board (rigid board) and a plug connector mounted on another circuit board (rigid board).

The receptacle connectors disclosed in Japanese Unexamined Patent Publication No. 2013-206771 and Japanese Patent Publication No. 5,250,450 are each provided with an insulator (receptacle insulator), a plurality of contacts (plurality of receptacle contacts) and a pair of metal fixing members (receptacle-side metal fixing members). The receptacle insulator is provided with an annular outer peripheral wall and a fitting recess formed inside the annular outer peripheral wall. The plurality of receptacle contacts are supported by the receptacle insulator to be aligned in the lengthwise direction of the receptacle connector. The pair of receptacle-side metal fixing members are fixed to the receptacle insulator by being press-fitted into mounting holes formed in the receptacle insulator. Each receptacle-side metal fixing member is provided with resilient contact portions which are resiliently deformable. Each receptacle contact can be mounted to a circuit pattern formed on a mounting surface of the associated circuit board, and each receptacle-side metal fixing member can be mounted to a ground pattern formed on the same mounting surface.

On the other hand, the plug connector is provided with an insulator (plug insulator), a plurality of contacts (plurality of plug contacts) and a pair of metal fixing members (plug-side metal fixing members). The plug insulator is provided with an annular projecting fitting portion capable of being fitted into the aforementioned fitting recess of the receptacle insulator. Each plug contact can be mounted to a circuit pattern formed on a mounting surface of the associated circuit board, and each plug-side metal fixing member can be mounted to a ground pattern formed on the same mounting surface.

Upon the projecting fitting portion of the plug connector being fitted into (connected to) the fitting recess of the receptacle connector, the plurality of plug contacts come into contact with the plurality of receptacle contacts, respectively, which establishes electrical continuity between electronic parts mounted on the circuit board on the receptacle connector side and electronic parts mounted on the circuit board on the plug connector side.

Upon the receptacle connector and the plug connector being connected, the plug-side metal fixing members come into contact with resilient contact portions of the receptacle-side metal fixing members and the receptacle-side metal fixing members and the plug-side metal fixing members become firmly engaged with each other, so that the engaged state between the receptacle connector and the plug connector is securely maintained. In addition, the operator can feel a tactile click upon each plug-side metal fixing member being engaged with the resilient contact portions of the associated receptacle-side metal fixing member.

In addition, since each receptacle-side metal fixing member has the resilient contact portions noted above, the receptacle-side metal fixing members and the plug-side metal fixing members are firmly engaged with each other even when the receptacle-side metal fixing members and the plug-side metal fixing members are re-connected to each other after being connected to and then disconnected from each other.

In the case where either the receptacle-side metal fixing members or the plug-side metal fixing members are provided with no resilient contact portions, the possibility of the receptacle-side metal fixing members and/or the plug-side metal fixing members getting scratched or damaged becomes high if only the receptacle connector and the plug connector are connected once. If the receptacle-side metal fixing members and/or the plug-side metal fixing members get scratched or damaged, the engaging force between each receptacle-side metal fixing member and the associated plug-side metal fixing member when the receptacle-side metal fixing members and the plug-side metal fixing members are re-connected to each other after being connected to and then disconnected from each other deteriorates, so that the force to hold an engaged state between the receptacle connector and the plug connector may deteriorate, and the operator may not be able to feel the tactile click.

In recent years, miniaturization (especially thickness reduction) of connectors has progressed with reduction in thickness of electronic and electric apparatuses, and accordingly, miniaturization of receptacle insulators and receptacle-side metal fixing members have also progressed.

In the structure in which receptacle-side metal fixing members are fixed to a receptacle insulator by press-fitting as shown in Japanese Unexamined Patent Publication No. 2013-206771 and Japanese Patent Publication No. 5,250,450, there is a possibility of the strength of the fixation of each receptacle-side metal fixing member to the receptacle insulator (the aforementioned mounting holes) becoming small. If this fixation strength becomes small, the separating resistance of the receptacle connector with respect to the associated circuit board, the force to hold an engaged state between the receptacle connector and the plug connector and the feeling of a tactile click that the operator feels upon connection between the receptacle connector and the plug connector decrease.

Additionally, the rigidity of the receptacle insulator easily decreases due to the shape of the receptacle insulator (the shape of the periphery of the aforementioned mounting holes, etc.) becoming so complicated that a thin-wall portion(s), etc., are formed. Accordingly, there is a possibility of the receptacle insulator being deformed or damaged when the receptacle connector and the connector are connected. Additionally, resin flowability (moldability) easily decreases due to the complicated shape of the receptacle insulator, which is not favorable in terms of productivity.

SUMMARY OF THE INVENTION

The present invention provides a receptacle connector and a method of producing a receptacle connector, even though each receptacle-side metal fixing member is firmly engageable with the plug connector even after the receptacle connector and the plug connector are connected and disconnected a plurality of times, the strength of the fixation of each receptacle-side metal fixing member to the receptacle insulator of the receptacle connector can be increased even when the connector, which is configured of the receptacle connector and an associated plug connector, is miniaturized.

According to an aspect of the present invention, a receptacle connector is provided, including a receptacle insulator made of synthetic resin which includes an annular outer peripheral wall which defines a fitting recess on a circumferentially inner side of the annular outer peripheral wall; a plurality of receptacle contacts which are mountable to a circuit pattern on a receptacle-side circuit board and supported by the receptacle insulator; and a receptacle-side metal fixing member which is mountable to the receptacle-side circuit board and supported by the receptacle insulator. When a projecting fitting portion of a plug insulator of a plug connector is fitted into the fitting recess of the receptacle insulator, a plurality of plug contacts of the plug connector, which are mountable to a circuit pattern on a plug-side circuit board and supported by the plug insulator, come into contact with the plurality of receptacle contacts, and the plug connector comes into contact with the receptacle-side metal fixing member. The receptacle-side metal fixing member and the receptacle insulator are integrally formed by insert molding. The receptacle-side metal fixing member includes a resilient contact portion which is spaced from a surface of the outer peripheral wall on the circumferentially inner side thereof when the resilient contact portion is in a free state.

The outer peripheral wall can include a pair of widthwise structural portions and a pair of lengthwise structural portions, the outer peripheral wall being rectangular in shape, wherein the receptacle-side metal fixing member includes a widthwise fixing portion which is fixed to one of the pair of widthwise structural portions and extends along a direction of extension of the pair of widthwise structural portions; and a pair of lengthwise fixing portions which are fixed to one of the pair of lengthwise structural portions and extend in a lengthwise direction of the outer peripheral wall from opposite ends of the widthwise fixing portion. A pair of the resilient contact portions extend from the pair of lengthwise structural portions, respectively.

In this case, the plug connector can include a plug-side metal fixing member which is supported by the plug insulator. The plug-side metal fixing member comes into contact with the one of the pair of widthwise structural portions and the pair of resilient contact portions of the receptacle-side metal fixing member when the projecting fitting portion of the plug insulator is fitted into the fitting recess of the receptacle insulator.

It is desirable for the projecting fitting portion of the plug insulator to be annular in shape. The receptacle insulator includes an engaging protrusion which is positioned on the circumferentially inner side of the annular outer peripheral wall. The engaging protrusion is engaged inside the annular projecting fitting portion of the plug insulator when the annular projecting fitting portion of the plug insulator is fitted into the fitting recess of the receptacle insulator. The engaging protrusion includes an inclined guide surface which comes into contact with the plug-side metal fixing member when the annular projecting fitting portion of the plug insulator is fitted into the fitting recess of the receptacle insulator.

In an embodiment, a method of producing a receptacle connector, is provided, the receptacle connector including a receptacle insulator made of synthetic resin which includes an annular outer peripheral wall that defines a fitting recess on a circumferentially inner side of the annular outer peripheral wall; a plurality of receptacle contacts which are mountable to a circuit pattern on a receptacle-side circuit board and supported by the receptacle insulator; and a receptacle-side metal fixing member which is mountable to the receptacle-side circuit board and includes a fixing portion which is fixed to the receptacle insulator, wherein, when a projecting fitting portion of a plug insulator of a plug connector is fitted into the fitting recess of the receptacle insulator, a plurality of plug contacts of the plug connector which are mountable to a circuit pattern on a plug-side circuit board and supported by the plug insulator come into contact with the plurality of receptacle contacts, and the plug connector comes into contact with the receptacle-side metal fixing member. The method of producing the receptacle connector includes resiliently deforming a resilient contact portion which is formed on the receptacle-side metal fixing member toward a circumferentially outer side of the outer peripheral wall using molding dies; integrating the fixing portion of the receptacle-side metal fixing member and the receptacle insulator by insert molding, wherein a shape of a surface of the outer peripheral wall on the circumferentially inner side thereof being defined by the resilient contact portion; and separating the molding dies from the receptacle insulator and the receptacle-side metal fixing member to allow the resilient contact portion to resiliently return to a free state thereof, thereby disengaging the resilient contact portion from the surface of said outer peripheral wall.

According to the present invention, since the receptacle-side metal fixing member and the receptacle insulator are formed integrally with each other by insert molding, the strength of the fixation of the receptacle-side metal fixing member to the receptacle insulator of the receptacle connector can be increased even when the connector, which is configured of the receptacle connector and an associated plug connector, is miniaturized.

The rigidity of a portion of the receptacle insulator (receptacle connector) in the vicinity of the receptacle-side metal fixing member can be increased compared with the case where a mounting hole, etc., into which the receptacle-side metal fixing member is fitted and installed, is formed in the receptacle insulator. Accordingly, the receptacle insulator can be prevented from being deformed or damaged when the plug connector and the receptacle connector are connected.

In addition, since the receptacle-side metal fixing member is provided with a resilient contact portion which is spaced from a surface of the outer peripheral wall on the circumferentially inner side thereof when the resilient contact portion is in a free state, the receptacle-side metal fixing member and the plug connector can be firmly engaged with each other even when the receptacle connector and the plug connector are repeatedly connected and disconnected, e.g., when the receptacle connector and the plug connector are re-connected to each other after being connected to and then disconnected from each other.

According to the method of producing a receptacle connector according to the present invention, the shape of the surface of the outer peripheral wall on the circumferentially inner side thereof can be defined by the resilient contact portion because insert molding is carried out with the resilient contact portion of the receptacle side metal fixing member resiliently deformed circumferentially outwards using a molding die. In addition, the resilient contact portion can be made to be spaced circumferentially inwards from the surface of the (cured) outer peripheral wall on the circumferentially inner side thereof by the resilient contact portion returning to its free state upon the molding die being released and separated from the receptacle insulator and the receptacle-side metal fixing member.

Additionally, since the shape of the surface of the outer peripheral wall on the circumferentially inner side thereof is defined by the resilient contact portion, no through-holes need to be formed in the receptacle insulator (the bottom thereof). Namely, in the case where the shape of the surface of the outer peripheral wall on the circumferentially inner side thereof is not defined by the resilient contact portion, the insert molding is performed with the resilient contact portion being sandwiched between the aforementioned molding die and another molding die, and the shape of the surface of the outer peripheral wall on the circumferentially inner side thereof is defined by this other molding die. However, according to this receptacle connector molding method, through-holes are formed in the receptacle insulator (the bottom thereof) due to the presence of the aforementioned other molding die when the receptacle insulator is cured. If through-holes are formed in the receptacle insulator (the bottom thereof), it becomes difficult to isolate the resilient contact portion of the receptacle-side metal fixing member and the circuit board (to which the receptacle connector is mounted) from each other, and the mechanical strength of the receptacle insulator deteriorates. However, according to the method of producing a receptacle connector according to the present invention, there is no possibility of the above described problems arising.

BRIEF DESCRIPTION OF THE DRAWINGS

The present invention will be discussed below in detail with reference to the accompanying drawings, in which.

DESCRIPTION OF THE EMBODIMENTS

Figure 1:
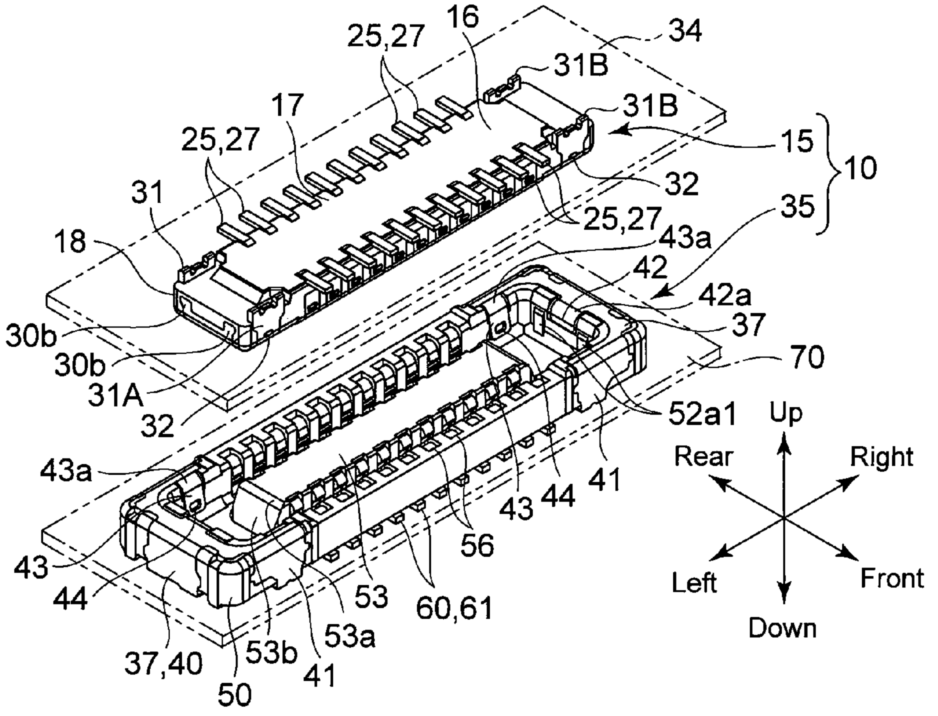
FIG. 1 is a perspective view of an embodiment of a connector configured of a receptacle connector and a plug connector, according to the present invention, in a disconnected state, viewed obliquely from above.

An embodiment of a connector according to the present invention will be hereinafter discussed with reference to FIGS. 1 through 16. In the following descriptions, forward and rearward directions, leftward and rightward directions, and upward and downward directions of the connector 10 are determined with reference to the directions of the double-headed arrows shown in the drawings.

The present embodiment of the connector 10 is provided with a plug connector 15 and a receptacle connector 35.

Figure 4:
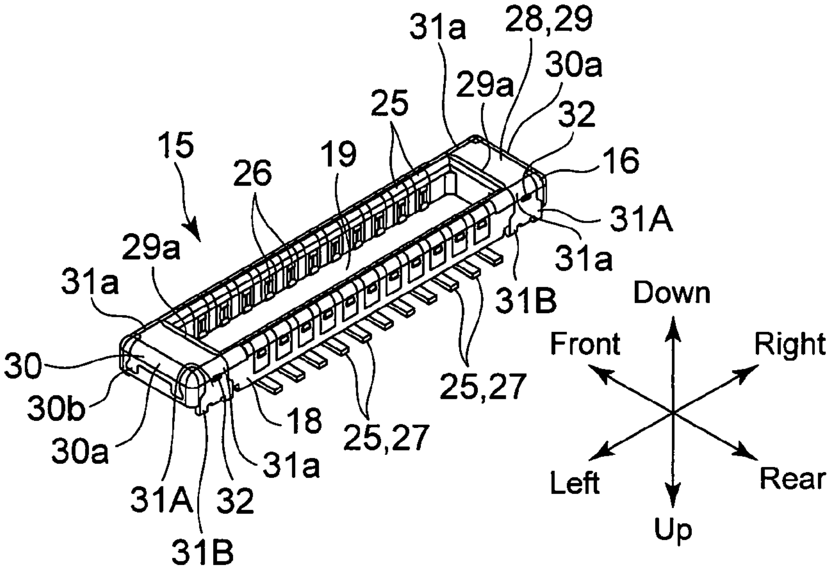
FIG. 4 is a perspective view of the plug connector, showing the plug connector with the top side down.
Figure 5:
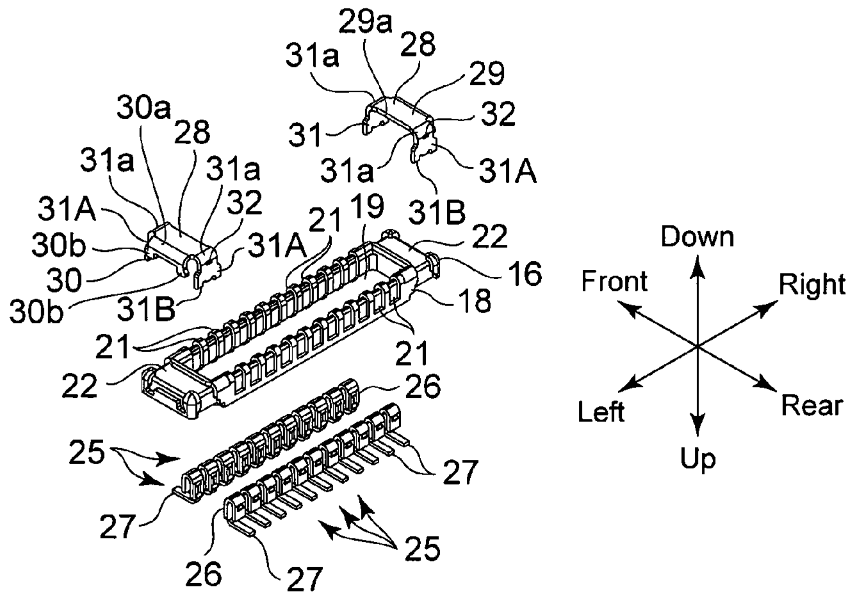
FIG. 5 is an exploded perspective view of the plug connector, showing the plug connector with the top side down.
Figure 6:
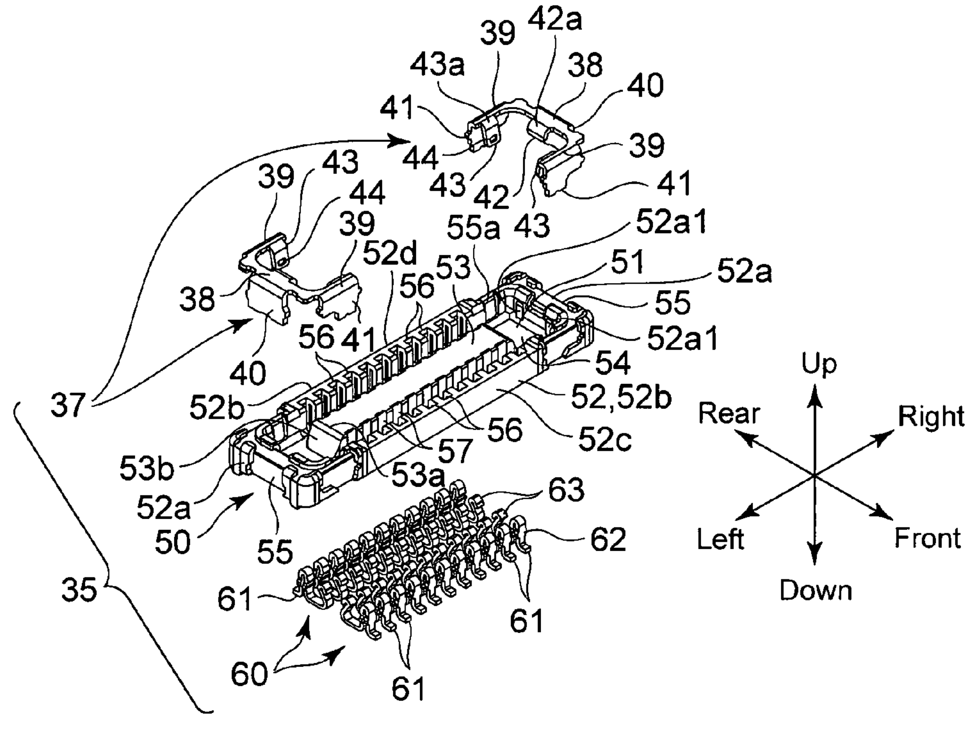
FIG. 6 is an exploded perspective view of the receptacle connector, viewed obliquely from above.
Figure 7:
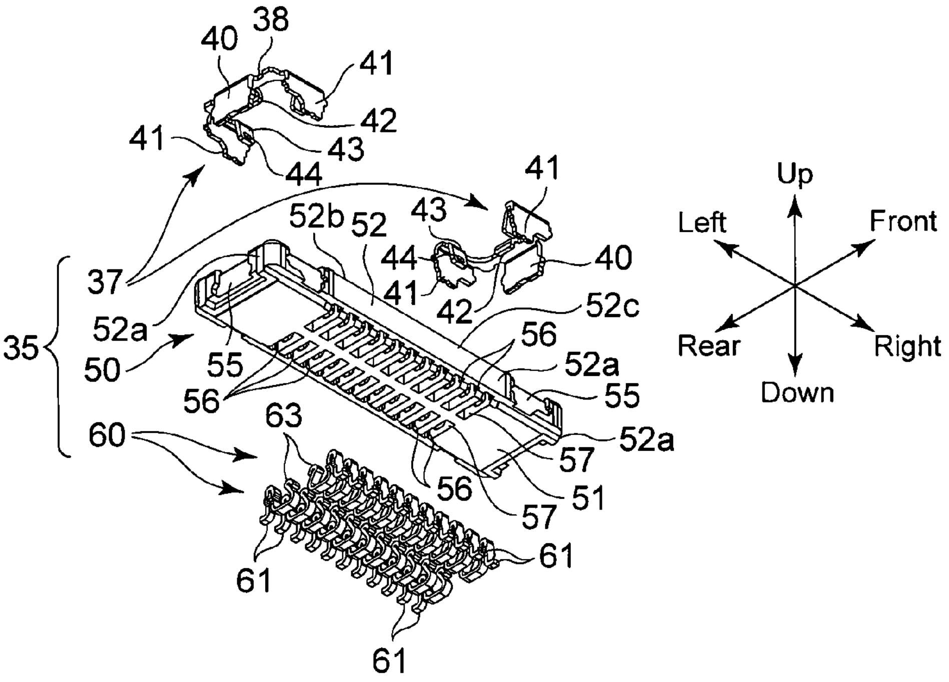
FIG. 7 is an exploded perspective view of the receptacle connector, viewed obliquely from below.
Figure 8:
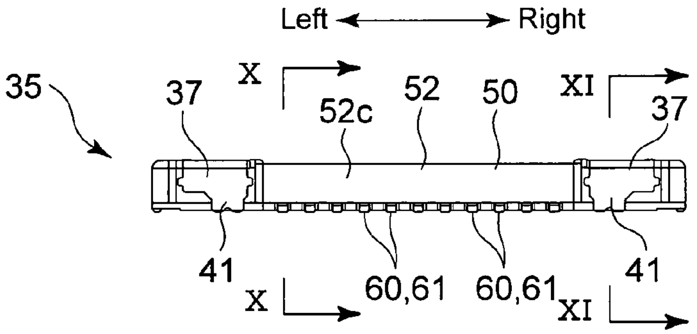
FIG. 8 is a front elevational view of the receptacle connector.
Figure 9:
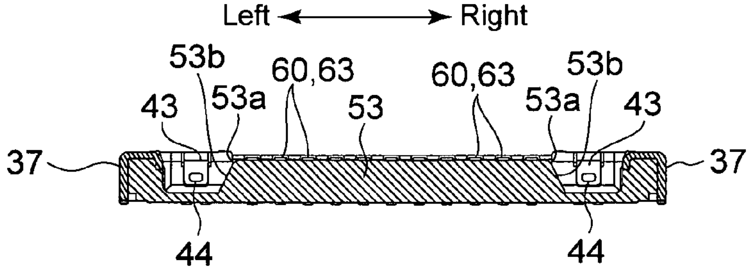
FIG. 9 is a longitudinal sectional view of a central portion of the receptacle connector.
Figure 10:
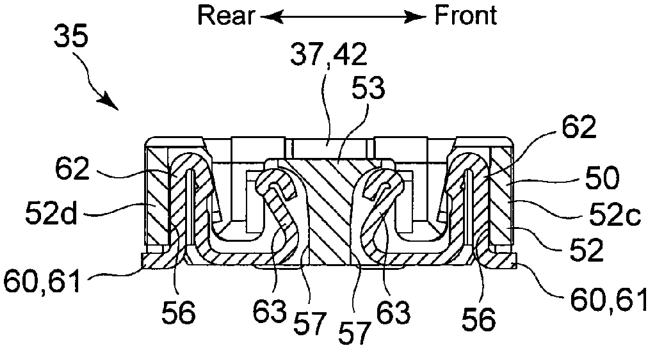
FIG. 10 is a cross sectional view taken along the line X-X shown in FIG. 8, viewed in the direction of the appended arrows.

First, the detailed structure of the plug connector 15 will be hereinafter discussed with reference mainly to FIGS. 4 and 5.

The plug connector 15 is provided with a plug insulator 16, a plurality of plug contacts (two (front and rear) arrays of plug contacts) 25 and two plug-side metal fixing members 28, which constitute major elements of the plug connector 15. The plug connector 15 is fully integrated by insert molding using forming dies (not shown) for molding the plug connector 15.

The plug insulator 16 is formed from electrical-insulative and heat-resistant synthetic resin and is shaped into a tabular member extending in the leftward/rightward direction. The plug insulator 16 is provided with a top plate portion 17 which constitutes the top of the plug insulator 16 and a projecting fitting portion 18, having the shape of an annular wall, which projects downward from the entire outer edge of the lower surface of the top plate portion 17. The space formed between the top plate portion 17 and the projecting fitting portion 18 forms an engaging recess 19. The plug insulator 16 is provided, in each of the front and rear walls of the projecting fitting portion 18, with a plurality of contact fixing grooves (two (front and rear) arrays of contact fixing grooves) 21 which are arranged in the leftward/rightward direction and each of which is formed into a substantially U-shaped in cross section, extending from one side (front/rear side) to the other side (rear/front side) of the wall (the front/rear wall of the projecting fitting portion 18) across the lower end of the wall (see FIG. 5). In addition, the plug insulator 16 is provided, on the surfaces of the left and right ends thereof, with left and right metal fitting member fixing recesses 22, respectively (see FIG. 5).

Figure 2:
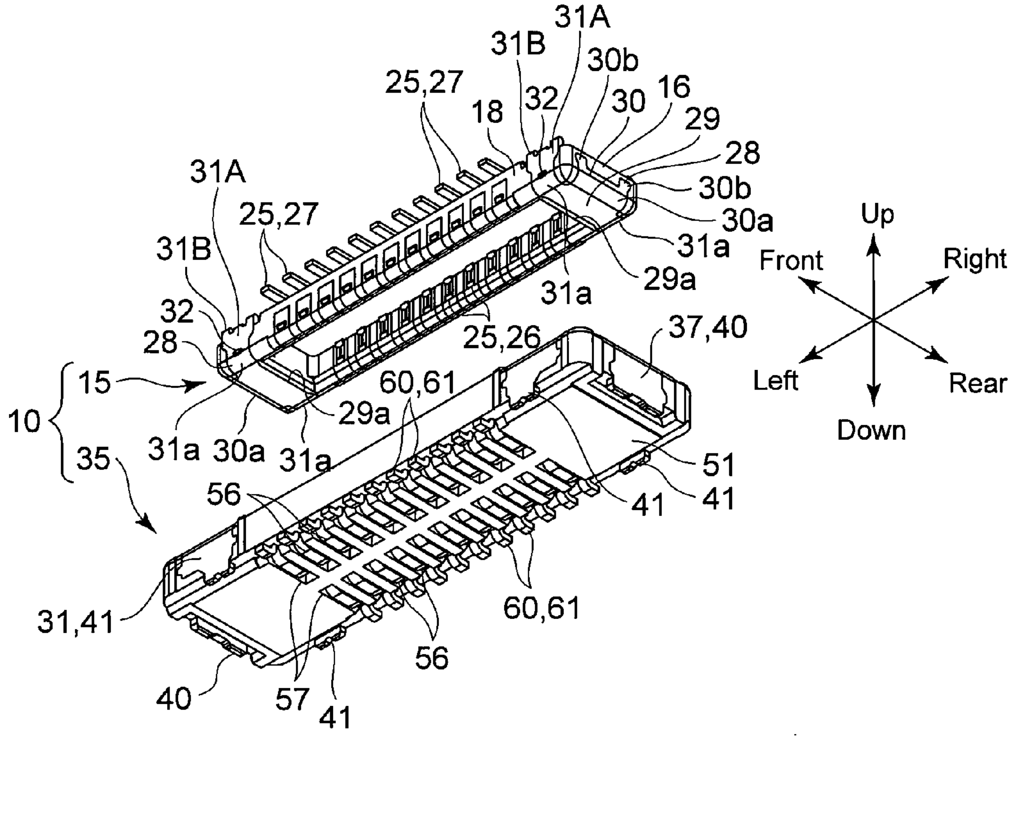
FIG. 2 is a perspective view of the receptacle connector and the plug connector in a disconnected state, viewed obliquely from below.
Figure 3:
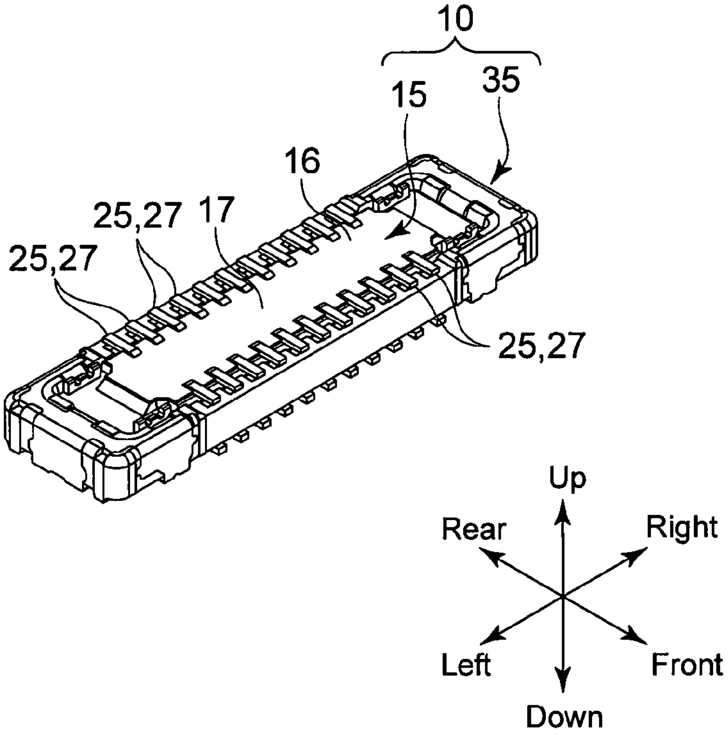
FIG. 3 is a perspective view of the receptacle connector and the plug connector in a connected state, viewed obliquely from above.

The plurality of plug contacts 25 are each made of sheet copper alloy (for example, phosphor bronze, beryllium copper, titanium copper or Corson copper alloy) having spring elasticity, and are formed into shapes as shown in FIGS. 1, 2, etc., by stamp forming. The surface of each plug contact 25 is coated with plating such tin-plating or gold-plating. Each plug contact 25 is provided with a contact portion 26 and a tail portion 27. The contact portion 26 constitutes the inner part of the substantially U-shaped body of the plug contact 25 and extends in the vertical (upward/downward) direction, and the tail portion 27 extends substantially horizontally (in the forward/rearward direction) from the upper end of the outer part of the body of the plug contact 25. The plug contacts 25, except the tail portions 27 thereof, are embedded in the contact fixing grooves 21.

Each plug-side metal fixing member 28 is formed into the shape shown in the drawings by stamping a metal plate, and the surface of each plug-side metal fixing member 28 is coated with plating such as tin-plating or gold-plating.

Each plug-side metal fixing member 28 is provided with a base portion 29, an end fixing portion 30, a pair of contact portions 31A, tail portions 31B and lock projections 32. In each plug-side metal fixing member 28, the base portion 29 has the shape of a flat plate which is positioned to lie in a plane orthogonal to the vertical direction, the end fixing portion 30 projects upward from a peripheral edge of the base portion 29, the pair of contact portions 31A project upward from peripheral edges of the base portion 29, the tail portions 31B respectively project upward from the pair of contact portions 31A, and the lock projections 32 respectively project from surfaces of the pair of contact portions 31A. The outer surface of the connecting portion of each plug-side metal fixing member 28 which connects the end fixing portion 30 and the base portion 29 is formed into a rounded surface 30*a*, and the outer surfaces of the two connecting portions of each plug-side metal fixing member 28 which connect the base portion 29 and the pair of contact portions 31A are formed into rounded surfaces 31*a*, respectively. The end fixing portion 30 of each plug-side metal fixing member 28 is provided at the upper end thereof with a pair of retaining projections 30*b* which are spaced from each other in the forward/rearward direction, so that there is little possibility of the end fixing portion 30 of each plug-side metal fixing member 28 coming off the plug insulator 16 (downward) even if the plug connector 15 and the receptacle connector 35 are repeatedly connected and disconnected. The inner edge of the base portion 29, of each plug-side metal fixing member 28, which is positioned on the opposite side of the base portion 29 from the rounded surface 30*a*, is also formed into a rounded surface 29*a*. The upper ends of the pair of tail portions 31B of each plug-side metal fixing member 28 project slightly above from the upper end surface of the top plate portion 17 in the vertical direction.

The plug connector 15 that has the above described configuration is mounted to a mounting surface formed on one side (the lower side) of a circuit board 34 (rigid board/a plug-side circuit board; see FIG. 1). Specifically, the tail portion 27 of each plug contact 25 is soldered to a circuit pattern (not shown) formed on the mounting surface of the circuit board 34, and the pair of tail portions 31B of each plug-side metal fixing member 28 are soldered to a ground pattern (not shown) formed on the same mounting surface of the circuit board 34 (i.e., are connected using a straight (ST) connection). In addition to the plug connector 15, electronic parts (e.g., a module for high-performance, a semi-conductor, a large-capacity memory, etc.) are mounted to the mounting surface of the circuit board 34.

The detailed structure of the receptacle connector 35 will be hereinafter discussed with reference to FIGS. 1, 2 and 6 through 13.

The receptacle connector 35 is provided with a pair of receptacle-side metal fixing members 37, a receptacle insulator 50 and a plurality of receptacle contacts 60, which constitute major elements of the receptacle connector 35.

The pair of receptacle-side metal fixing members 37 are positioned at the opposite ends of the receptacle connector 35 with respect to the leftward/rightward direction and are each symmetrical in shape in the forward/rearward direction. Each receptacle-side metal fixing member 37 is formed by pressing a metal plate into shape, and the surface of each receptacle-side metal fixing member 37 is coated with a plating such as tin-plating or gold-plating. Each receptacle-side metal fixing member 37 is provided with a widthwise fixing portion 38, a pair of lengthwise fixing portions 39, a widthwise tail portion 40, a pair of lengthwise tail portions 41, a fixing lug 42 and a pair of resilient contact portions 43. In each receptacle-side metal fixing member 37, the widthwise fixing portion 38 extends in the forward/rearward direction, the pair of lengthwise fixing portions 39 extend in the leftward/rightward direction from both ends (front and rear ends) of the widthwise fixing portion 38, the widthwise tail portion 40 extends substantially downward from the outer edge of the widthwise fixing portion 38, the pair of lengthwise tail portions 41 extend substantially downward from the outer edges of the pair of lengthwise fixing portions 39, the fixing lug 42 extends substantially downward from the inner edge of the widthwise fixing portion 38, and the pair of resilient contact portions 43 extend substantially downward from the inner edges of the pair of lengthwise fixing portions 39. Each resilient contact portion 43 is rectangular in cross sectional shape (see FIG. 13), and a lock recess 44 is formed on the inner surface of each resilient contact portion 43. In addition, the end (fixed end) of the fixing lug 42 of each receptacle-side metal fixing member 37 on the widthwise fixing portion 38 side thereof is formed into a rounded surface 42*a*, and the ends (fixed ends) of the pair of resilient contact portions 43 of each receptacle-side metal fixing member 37 on the pair of lengthwise fixing portions 39 side thereof are formed into rounded surfaces 43*a*, respectively.

Figure 12:
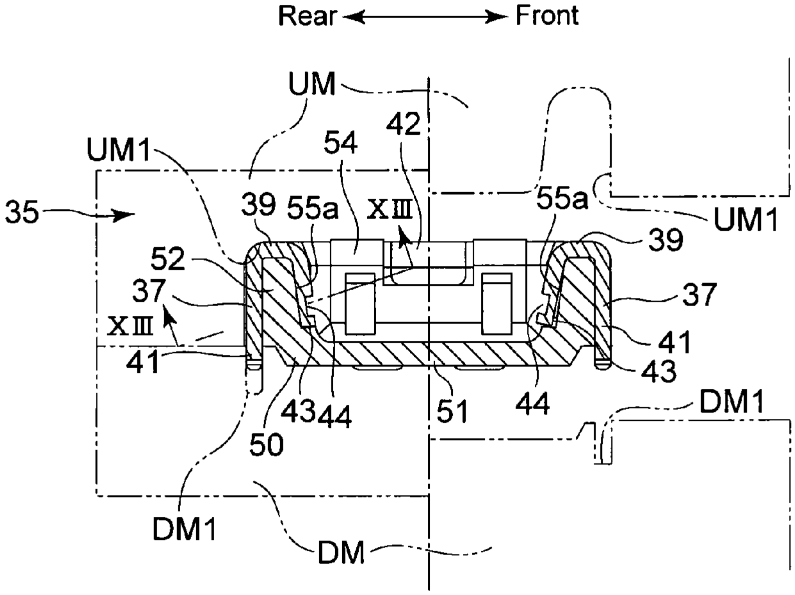
FIG. 12 is a view similar to that of FIG. 11, showing when the receptacle insulator and a pair of receptacle-side metal fixing members are integrally formed by insert molding, wherein a rear half of the drawing shows a mold-clamping state in which the receptacle connector is clamped between an upper molding die and a lower molding die (both shown by two-dot chain lines in the drawing) and a front half of the drawing shows a mold-opened state in which the upper molding die and the lower molding die are opened.
Figure 13:
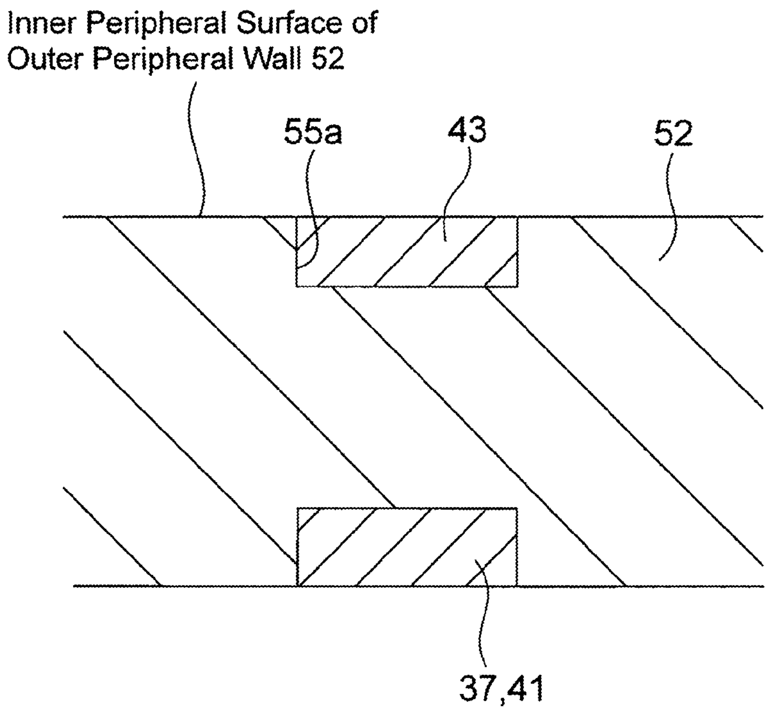
FIG. 13 is a cross sectional view taken along the line XIII-XIII shown in FIG. 12.
Figure 14:
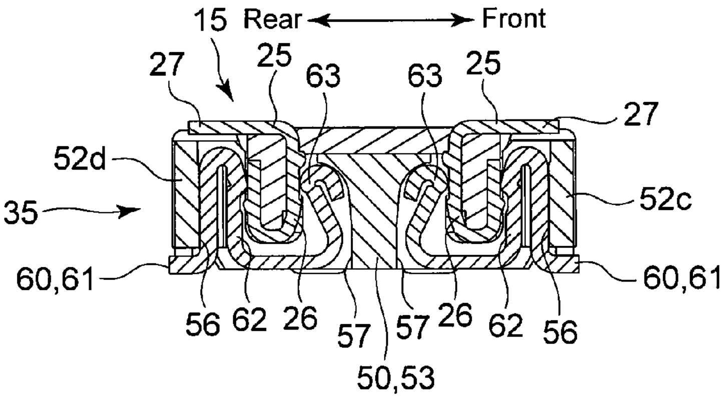
FIG. 14 is a view similar to that of FIG. 10, showing the receptacle connector and the plug connector in a connected state.

The receptacle insulator 50 is formed integral with the pair of receptacle-side metal fixing members 37 by insert molding using an upper molding die (forming die) UM and a lower molding die (forming die) DM, both of which are made of metal (see FIG. 12).

The lower surface of the upper molding die UM is formed from a flat surface, and the upper molding die UM is provided, in this flat lower surface in the vicinity of both the left and right ends thereof, with a front and rear pair (left pair) of metal-fixing-member corresponding recesses UM1 and another front and rear pair (right pair) of metal-fixing-member corresponding recesses UM1 which are formed to correspond to the left and right pair of receptacle-side metal fixing members 37, respectively (additionally, the upper molding die UM is further provided in the flat lower surface thereof with concavities and convexities which are formed and shaped to correspond to an outer peripheral wall 52, an engaging protrusion 53, a fitting recess 54, a plurality of contact fixing grooves (two (front and rear) arrays of contact fixing grooves) 56, a plurality of deformation allowing grooves (two (front and rear) arrays of deformation allowing grooves) 57, etc., which will be discussed in detail later). The upper surface of the lower molding die DM is formed from a flat surface, and the lower molding die DM is provided, in this flat upper surface in the vicinity of both the left and right ends thereof, with a front and rear pair (left pair) of metal-fixing-member corresponding recesses DM1 and another front and rear pair (right pair) of metal-fixing-member corresponding recesses DM1 which are formed to correspond to the left and right pair of receptacle-side metal fixing members 37, respectively (additionally, the lower molding die DM is further provided in the flat lower surface thereof with concavities and convexities which are formed and shaped to correspond to a bottom plate portion 51, the outer peripheral wall 52, the plurality of contact fixing grooves 56, the plurality of deformation allowing grooves 57, etc., which will be discussed in detail later).

When the pair of receptacle-side metal fixing members 37 and the receptacle insulator 50 are integrally formed by insert molding, firstly, while the lower ends of the pair of lengthwise tail portions 41 of each receptacle-side metal fixing member 37 which has been connected to a carrier (not shown) are being brought into contact and fitted into the associated pair of metal-fixing-member corresponding recesses DM1 (see the rear half of the lower molding die DM in FIG. 12), the pair of receptacle-side metal fixing members 37 are mounted on top of the lower molding die DM, and subsequently, the upper molding die UM positioned above the lower molding die DM is brought down to bring the lower surface of the upper molding die UM into contact with the upper surface of the lower molding die DM (i.e., to clamp the upper molding die UM and the lower molding die DM). Thereupon, each pair (left/right) of metal-fixing-member corresponding recesses UM1 of the upper molding die UM are fitted on the pair of lengthwise fixing portions 39, the pair of lengthwise tail portions 41 and the pair of resilient contact portions 43 of the associated receptacle-side metal fixing member 37, which is in a free state, from above, to resiliently deform each resilient contact portion 43 toward the associated lengthwise tail portion 41 (see the rear half of the upper molding die UM in FIG. 12).

Subsequently, in this die clamped state, an insulating and heat-resistant synthetic resin material (the constituent material of the receptacle insulator 50) is injected into the molding space formed between the upper molding die UM and the lower molding die DM, and the injected synthetic resin material is cured in the molding space. After the synthetic resin material is cured, the lower molding die DM and the upper molding die UM are opened and separated from each other (see the front half of the upper molding die UM and the lower molding die DM in FIG. 12). In addition, by cutting off each receptacle-side metal fixing member 37 from the aforementioned carrier (each receptacle-side metal fixing member 37 can be cut off from the carrier after the press-fitting operation described below in which the plurality of receptacle contacts 60 are press-fitted into the receptacle insulator 50), an integrated body of the pair of receptacle-side metal fixing members 37 and the receptacle insulator 50 obtained.

The completed receptacle insulator 50 is a member shown in FIGS. 6 through 12, etc., which extends in the leftward/rightward direction. The receptacle insulator 50 is provided with the bottom plate portion 51, the outer peripheral wall 52 and the engaging protrusion 53. The bottom plate portion 51 constitutes a lower part of the receptacle insulator 50, the outer peripheral wall 52 is formed of an annular wall, having the shape of a rectangle in a plan view, which projects upward from the entire peripheral edge of the upper surface of the bottom plate portion 51, and the engaging protrusion 53 projects upward from an upper surface of the bottom plate portion 51. The outer peripheral wall 52 is provided with a left and right pair of widthwise structural portions **52*a* and a front and rear pair of lengthwise structural portions 52*b* which connect both the front and rear ends of the left and right pair of widthwise structural portions 52*a*. Each widthwise structural portion 52*a* is provided on an inner surface thereof with a front and rear pair of contact projections 52*a*1. The engaging protrusion 53 is spaced circumferentially inwards from the outer peripheral wall 52 and extends linearly in the leftward/rightward direction. The upper ends of both the left and right ends of the engaging protrusion 53 are formed into rounded surfaces 53*a*. Both the left and right ends of the engaging protrusion 53 are formed into left and right inclined guide surfaces 53*b* which are inclined so as to approach the adjacent left and right pair of widthwise structural portions 52*a* in the downward direction, respectively. The annular space formed between the outer peripheral wall 52 and the engaging protrusion 53 forms the aforementioned fitting recess 54**.

The outer peripheral wall 52 is provided on the surfaces of both the left and right ends thereof with a left fixing groove 55 and a right fixing groove 55, respectively. The widthwise fixing portion (fixing portion) 38, the pair of lengthwise fixing portions (fixing portions) 39, the widthwise tail portion (fixing portion) 40, the pair of lengthwise tail portions (fixing portions) 41 and the fixing lug (fixing portion) 42 of the left receptacle-side metal fixing member 37 are embedded in the left fixing groove 55, while the widthwise fixing portion (fixing portion) 38, the pair of lengthwise fixing portions (fixing portions) 39, the widthwise tail portion (fixing portion) 40, the pair of lengthwise tail portions (fixing portions) 41 and the fixing lug (fixing portion) 42 of the right receptacle-side metal fixing member 37 are embedded in the right fixing groove 55. The widthwise fixing portions 38 of the left and right receptacle-side metal fixing member 37 are fixed to the left and right widthwise structural portion **52*a*, respectively, the front and rear pair of lengthwise fixing portion 39 of each receptacle-side metal fixing member 37 are fixed to the pair of lengthwise structural portions 52*b*, respectively, and the fixing lugs 42 of the left and right receptacle-side metal fixing member 37 are fixed to inner peripheral surfaces of the outer peripheral wall 52. Additionally, the outer peripheral wall 52 is provided, on the inner peripheral surfaces of both the left and right ends of the pair of lengthwise structural portions 52*b*, with a left pair of accommodating recesses 55*a* and a right pair of accommodating recesses 55*a* which are shaped to correspond to the pair of resilient contact portions 43 of the left receptacle-side metal fixing member 37 and the pair of resilient contact portions 43 of the right receptacle-side metal fixing member 37, respectively (each accommodating recesses 55*a* is rectangular in cross sectional shape; see FIG. 13). The left pair of accommodating recesses 55*a* and the right pair of accommodating recesses 55*a* are formed to be continuous with the left and right fixing grooves 55, respectively. When the lower molding die DM and the upper molding die UM are closed (i.e., before the lower molding die DM and the upper molding die UM are opened), the pair of resilient contact portions 43 of the left receptacle-side metal fixing member 37 are entirely positioned in the pair of accommodating recesses 55*a* and the pair of resilient contact portions 43 of the right receptacle-side metal fixing member 37 are entirely positioned in the right pair of accommodating recesses 55*a* (the surfaces of the pair of resilient contact portions 43 of each receptacle-side metal fixing member 37 which face the associated pair of accommodating recesses 55***a* are totally in contact with the inner surfaces of the associated pair of accommodating recesses 55*a*), and the inner surface of each resilient contact portion 43 is flush with the inner peripheral surface of the outer peripheral wall 52. However, opening the lower molding die DM and the upper molding die UM causes the pair of resilient contact portions 43 of each receptacle-side metal fixing member 37 to resiliently return to their free state, thus causing each resilient contact portion 43 to smoothly move away, inwardly, from the inner surface of the associated accommodating recess 55*a*, and accordingly, each resilient contact portion 43 is partly positioned in the associated accommodating recess 55*a*, and the inner surface of each resilient contact portion 43 slightly projects circumferentially inwards from the inner peripheral surface of the outer peripheral wall 52 to be spaced therefrom. Additionally, the lower ends of the widthwise tail portion 40 and the pair of lengthwise tail portions 41 of each receptacle-side metal fixing member 37 slightly project downward from the lower surface of the receptacle insulator 50.

The outer peripheral wall 52, except both the left and right ends of the front and rear pair of lengthwise structural portions 52*b*, is formed of a front wall 52*c* and a rear wall 52*d*. The front wall 52*c* is provided on the rear surface thereof with the front array of contact fixing grooves 56 (identical in number to the front array of plug contacts 25) which are arranged in the leftward/rightward direction and each of which extends in the vertical direction. Similarly, the rear wall 52*d* is provided on the front surface thereof with the rear array of contact fixing grooves 56 (identical in number to the rear array of plug contacts 25) which are arranged in the leftward/rightward direction and each of which extends in the vertical direction. The receptacle insulator 50 is provided, in a portion thereof which extends between the front surface of the engaging protrusion 53 and a portion of the bottom surface of the bottom plate portion 51 immediately in front of the engaging protrusion 53, with the front array of deformation allowing grooves 57. The front array of deformation allowing grooves 57 are formed to be communicatively connected to the front array of contact fixing grooves 56 on the front wall 52*c*, respectively (see FIGS. 6, 7 and 10). Similarly, the receptacle insulator 50 is provided, in a portion thereof which extends between the rear surface of the engaging protrusion 53 and a portion of the bottom surface of the bottom plate portion 51 immediately behind the engaging protrusion 53, with the rear array of deformation allowing grooves 57. The rear array of deformation allowing grooves 57 are formed to be communicatively connected to the rear array of contact fixing grooves 56 on the rear wall 52*d*, respectively (see FIGS. 6, 7 and 10).

Each receptacle contact 60 is formed in a similar manner to each plug contact 25. Each receptacle contact 60 is provided with a substantially horizontal tail portion 61, a stationary portion 62 which extends upward from the inner end of the tail portion 61 and a resilient contact portion 63 which has the shape of a substantially letter S and is communicatively connected to the upper end of the stationary portion 62.

Each receptacle contact 60 is fixed to the receptacle insulator 50, which is integral with the pair of receptacle-side metal fixing members 37, by being inserted into one contact fixing groove 56 and the associated deformation allowing groove 57 from below the receptacle insulator 50 and subsequently by (fixedly) press-fitting the stationary portion 62 into the contact fixing groove 56. In a state where the plurality of receptacle contacts 60 (the stationary portions 62) are fixed to the receptacle insulator 50 (the plurality of contact fixing grooves 56), the resilient contact portions 63 are spaced from the inner surfaces of the plurality of deformation allowing grooves 57, thus the resilient contact portions 63 are resiliently deformable inside the plurality of deformation allowing grooves 57 (see FIGS. 10 and 14). In addition, the tail portion 61 of each receptacle contact 60 is positioned below the lower surface of the bottom plate portion 51 (see FIGS. 10 and 14).

By soldering the tail portion 61 of each receptacle contact 60 to a circuit pattern (not shown) formed on the mounting surface of a circuit board (rigid board/receptacle-side circuit board) 70, having the shape of a plate parallel (or substantially parallel) to the circuit board 34, and by soldering the lower ends of the widthwise tail portion 40 and the pair of lengthwise tail portions 41 of each receptacle-side metal fixing member 37 to a ground pattern (not shown) formed on the same mounting surface of the circuit board 70, the receptacle connector 35 that has the above described configuration is fixed (mounted) onto the circuit board 70 (see FIG. 1) (using a straight (ST) connection). In addition to the receptacle connector 35, electronic parts (e.g., a CPU, a controller, a memory, etc.) are mounted onto the mounting surface of the circuit board 70.

The plug connector 15 and the receptacle connector 35 that have the above described configurations are connected to each other in a manner which will be discussed hereinafter.

First, as shown in FIGS. 1 and 2, the plug connector 15 and the receptacle connector 35 are made to face each other in the vertical direction with the positions of the plug connector 15 and the receptacle connector 35 in the forward/rearward direction and the leftward/rightward direction aligned. Subsequently, the plug connector 15 is brought down to fit the projecting fitting portion 18 and the engaging protrusion 53 into the fitting recess 54 and the engaging recess 19, respectively (see FIGS. 3, 14 and 15). Thereupon, the contact portion 26 of each plug contact 25 comes into contact with the resilient contact portion 63 of the associated receptacle contact 60 while resiliently deforming the resilient contact portion 63 of the associated receptacle contact 60; accordingly, electrical continuity is established between the circuit boards 34 and 70 via the plurality of plug contacts 25 and the plurality of receptacle contacts 60.

Figure 15:
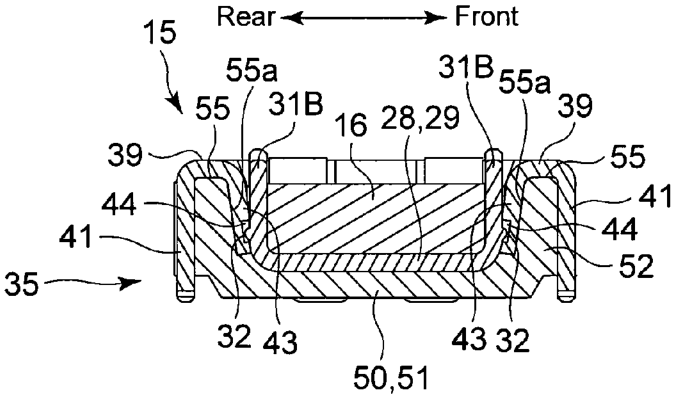
FIG. 15 is a view similar to that of FIG. 11, showing the receptacle connector and the plug connector in a connected state.

In addition, the front and rear pair of retaining projections 30*b* of the end fixing portion 30 of each (left/right) plug-side metal fixing member 28 comes into contact with the front and rear pair of contact projections 52*a*1 of the associated widthwise structural portion 52*a* of the outer peripheral wall 52 of the receptacle insulator 50 (however, the fixing lug 42 of each receptacle-side metal fixing member 37 and the associated plug-side metal fixing member 28 are spaced from each other), the pair of contact portions 31A of each (left/right) plug-side metal fixing member 28 come into contact with the pair of resilient contact portions 43 of the associated receptacle-side metal fixing member 37 while resiliently deforming the pair of resilient contact portions 43 of the associated receptacle-side metal fixing member 37 toward the pair of lengthwise tail portions 41 thereof, respectively (i.e., outwardly in the opposite directions away from each other in the forward/rearward direction), and the pair of lock projections 32 of each plug-side metal fixing member 28 are engaged in the lock recesses 44 of the pair of resilient contact portions 43 of the associated receptacle-side metal fixing member 37 (see FIG. 15).

Additionally, each plug-side metal fixing member 28 of the plug connector 15 is provided with the rounded surface 29*a*, the rounded surface 30*a* and the pair of rounded surfaces 31*a*, while the receptacle connector 35 is provided on the engaging protrusion 53 of the receptacle insulator 50 with the rounded surfaces 53*a* and the inclined guide surfaces 53*b*, and is provided on each receptacle-side metal fixing member 37 with the rounded surface 42*a* and the pair of rounded surfaces 43*a*. Accordingly, when the plug connector 15 is fitted into the receptacle connector 35, making the rounded surface 29*a*, the rounded surface 30*a* and the pair of rounded surfaces 31*a* of each plug-side metal fixing member 28 come into contact with the associated rounded surface 53*a* (and the associated inclined guide surface 53*b*) of the engaging protrusion 53 and the rounded surface 42*a* and the pair of rounded surfaces 43*a* of the associated receptacle-side metal fixing member 37, respectively, causes the rounded surfaces 29*a* of the pair of plug-side metal fixing members 28 and the rounded surfaces 53*a* (and the inclined guide surfaces 53*b*) of the engaging protrusion 53 to mutually exhibit a guiding function, causes the rounded surfaces 30*a* of the pair of plug-side metal fixing members 28 and the rounded surfaces 42*a* of the pair of receptacle-side metal fixing members 37 to mutually exhibit a guiding function, and causes the pair of rounded surfaces 31*a* of each plug-side metal fixing member 28 and the pair of rounded surfaces 43*a* of the associated receptacle-side metal fixing member 37 to mutually exhibit a guiding function. Additionally, the front and rear pair of retaining projections 30*b* of the end fixing portion 30 of each plug-side metal fixing member 28 of the plug connector 15 come into contact (sliding contact) with the front and rear pair of contact projections 52*a*1 of the associated widthwise structural portion 52*a* of the outer peripheral wall 52, which are made of resin. Accordingly, the plug connector 15 can be smoothly inserted and fitted into the receptacle connector 35.

In addition, in the present embodiment of the receptacle connector 35, the strength of the fixation of each receptacle-side metal fixing member 37 to the receptacle insulator 50 can be made great even when the connector 10 (the receptacle connector 35) is miniaturized because the pair of receptacle-side metal fixing members 37 and the receptacle insulator 50 are integrally formed by insert molding. Accordingly, even when the connector 10 (the receptacle connector 35) is miniaturized, the separating resistance of the receptacle connector 35 with respect to the circuit board 70 and the force to hold an engaged state between each plug-side metal fixing member 28 (the plug connector 15) and the associated receptacle-side metal fixing member 37 (the receptacle connector 35) can be enhanced.

Figure 11:
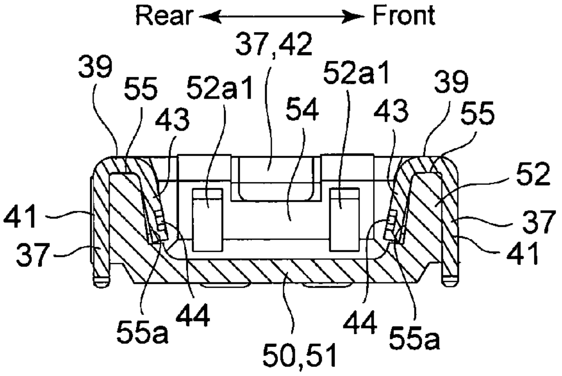
FIG. 11 is a cross sectional view taken along the line XI-XI shown in FIG. 8, viewed in the direction of the appended arrows.

Additionally, when in a free state, the pair of resilient contact portions 43 of each receptacle-side metal fixing member 37 are spaced from the surface of the associated accommodating recess 55*a* of the outer peripheral wall 52 (the surface of the outer peripheral wall 52 on the circumferentially inner side thereof) and thus capable of being resiliently deformed in the wall-thickness direction (see FIG. 11). Accordingly, even when the receptacle connector 35 and the plug connector 15 are re-connected to each other after being connected to and then disconnected from each other, the receptacle-side metal fixing members 37 and the plug-side metal fixing members 28 can be firmly engaged with each other.

In the present embodiment of the receptacle connector 35, the outer peripheral wall 52 is formed with the shapes of the circumferentially inner surfaces of both the left and right ends of the pair of lengthwise structural portions 52*b* being defined by the resilient contact portions 43 of the pair of receptacle-side metal fixing members 37 (specifically by surfaces of the resilient contact portions 43 of the pair of receptacle-side metal fixing members 37 which face the lengthwise tail portions 41 thereof, respectively) by forming the receptacle connector 35 by insert molding with the resilient contact portions 43 of each pair of receptacle-side metal fixing members 37 being resiliently deformed circumferentially outwards by the upper molding die UM (the associated pair of metal-fixing-member corresponding recesses UM1 thereof). Subsequently, after the completion of the insert molding process, the upper molding die UM is removed from the receptacle insulator 50 (the fitting recess 54) to thereby allow each resilient contact portion 43 to return to its free state, which causes each resilient contact portion 43 to be spaced circumferentially inwards from the surface of the associated accommodating recess 55*a* of the outer peripheral wall 52 (specifically from the surface of the (cured) outer peripheral wall 52 on the circumferentially inner side thereof).

Figure 16:
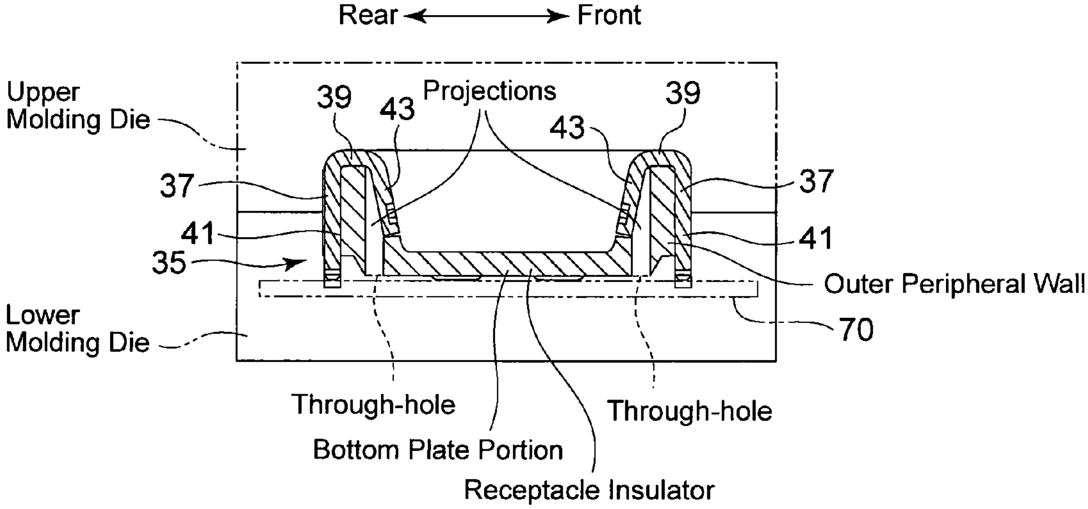
FIG. 16 is a view similar to that of FIG. 12, showing a comparative example of the receptacle connector.

Since the shapes of the circumferentially inner surfaces of both the left and right ends of the pair of lengthwise structural portions 52*b* are defined by the resilient contact portions 43 of the left and right pair of receptacle-side metal fixing members 37 (specifically by surfaces of the resilient contact portions 43 of the left and right pair of receptacle-side metal fixing members 37 which face the lengthwise tail portions 41 thereof, respectively), no through-holes, positioned directly below the left and right pair of receptacle-side metal fixing members 37, need to be formed in the receptacle insulator 50 (the bottom plate portion 51 thereof). Namely, in the case where the shapes of the circumferentially inner surfaces of both the left and right ends of the pair of lengthwise structural portions 52*b* (surfaces of the left and right accommodating recesses 55*a*) are not defined by the resilient contact portions 43 of the left and right pair of receptacle-side metal fixing members 37, a lower molding die different in type from the lower molding die DM needs to be used, as shown in the comparative example of FIG. 16. This lower molding die is provided on the upper surface thereof with a pair of projections (front and rear projections) which project upward; additionally, when the receptacle connector shown in FIG. 16 is formed by insert molding, the front and rear projections are respectively made to come into contact with those surfaces of the pair of resilient contact portions 43 of each receptacle-side metal fixing member 37 which face the pair of lengthwise tail portions 41 thereof (so that each resilient contact portion 43 is sandwiched between an upper molding die and the associated front or rear projection), and a clearance is created between each of the front and rear projections and the associated (adjacent) lengthwise tail portion 41 of each receptacle-side metal fixing member 37. In this state, if the receptacle connector shown in FIG. 16 is formed by insert molding, since a synthetic resin material serving as the constituent material of the receptacle insulator 50 flows in between each (front and rear) projection and the associated (adjacent) lengthwise tail portion 41, an outer peripheral wall between each (front and rear) projection and the associated lengthwise tail portion 41 is formed, as shown in FIG. 16. However, according to such a receptacle connector molding method, through-holes, positioned directly below the left and right pair of receptacle-side metal fixing members 37, are formed in the bottom plate portion of the receptacle insulator due to the presence of the aforementioned projections of the lower molding die when the receptacle insulator is cured (see FIG. 16).

However, the formation of through-holes, positioned directly below the left and right pair of receptacle-side metal fixing members 37, in the bottom plate portion makes it difficult to electrically isolate the pair of resilient contact portions 43, of each receptacle-side metal fixing member 37, and the circuit board 70 from each other. In addition, the outer peripheral wall (portions thereof which face the resilient contact portions 43 of the pair of receptacle-side metal fixing members 37) of the receptacle connector shown in FIG. 16 becomes smaller in wall thickness than the outer peripheral wall 52 (portions thereof which face the resilient contact portions 43 of the pair of receptacle-side metal fixing members 37) of the present embodiment of the receptacle connector 35, thus causing a reduction of the mechanical strength of the receptacle insulator and also causing a reduction of the support strength of the pair of receptacle-side metal fixing members 37 that is provided by the outer peripheral wall (portions thereof which face the resilient contact portions 43 of the pair of receptacle-side metal fixing members 37). Additionally, a reduction of the wall thickness of the outer peripheral wall (portions thereof which face the resilient contact portions 43 of the pair of receptacle-side metal fixing members 37) causes a reduction in flowability of the synthetic resin which constitutes the aforementioned portions of the outer peripheral wall, which makes it difficult to form the shapes of these portions with high precision.

In contrast, according to the method of producing the above illustrated embodiment of the receptacle connector 35, there is no possibility of the above described problems arising.

Additionally, each receptacle-side metal fixing member 37 of the receptacle connector 35 is in the shape of a substantially letter U in a plan view, and accordingly, the strength of the fixation of each receptacle-side metal fixing member 37 to the receptacle insulator 50 is greater than that in the case of each receptacle-side metal fixing member being linear in shape, in a plan view (e.g., in the case where each receptacle-side metal fixing member is shaped having only portions corresponding to the widthwise fixing portion 38 and the widthwise tail portion 40). Additionally, the receptacle connector 35 is provided with the rounded surfaces 53*a*, the inclined guide surfaces 53*b*, the rounded surfaces 42*a* and the rounded surfaces 43*a*. According to this structure, even in the case where the connector 10 (the receptacle connector 35) is downsized (miniaturized), it is possible to reduce the possibility of each receptacle-side metal fixing member 37 coming off from the receptacle insulator 50 and to insert and fit the plug connector 15 into the receptacle connector 35 smoothly from various angles (in a plan view).

Additionally, since the strength of the fixation of each receptacle-side metal fixing member 37 to the receptacle insulator 50 is great due to the pair of receptacle-side metal fixing members 37 and the receptacle insulator 50 being integrally formed by insert molding, both ends of the receptacle insulator 50 in the leftward/rightward direction can be prevented from being deformed or damaged when the plug connector 15 and the receptacle connector 35 are connected.

In addition, since the plug connector 15 is provided with the two plug-side metal fixing members 28 that are brought into contact with the two receptacle-side metal fixing members 37 of the receptacle connector 35, the possibility of the plug connector 15 (the plug insulator 16) being deformed or damaged by contact with the receptacle-side metal fixing members 37 is small compared with the case where the plug insulator 16 is brought into contact with the receptacle-side metal fixing members 37 with the plug-side metal fixing members 28 omitted from the plug connector 15.

Additionally, since the plug-side metal fixing members 28 and the receptacle-side metal fixing members 37 are mutually connected, static electricity flowing to the plug connector 15 from hands, etc., of a worker/technician, etc., can intentionally be made to flow to the aforementioned ground pattern of the circuit board 70 via the plug-side metal fixing members 28 and the receptacle-side metal fixing members 37 when the plug connector 15 and the receptacle connector 35 are connected. Therefore, the possibility of electronic components, etc., which are connected to the circuit board 70 (and the circuit board 34), being damaged by electrostatic discharge when static electricity that has reached the receptacle-side metal fixing members 37 is discharged to the plurality of receptacle contacts 60 (and the aforementioned circuit pattern of the circuit board 70) is small.

Furthermore, it is possible to pass a current for grounding through the plug-side metal fixing members 28 and the receptacle-side metal fixing members 37 after the plug connector 15 and the receptacle connector 35 are connected. If the plug-side metal fixing members 28 and the receptacle-side metal fixing members 37 are mounted to the circuit patterns of the circuit board 34 and the circuit board 70, respectively, it is possible to feed approximately a few amperes of current, supplied by a power supply or the like, through the plug-side metal fixing members 28 and the receptacle-side metal fixing members 37 after the plug connector 15 and the receptacle connector 35 are connected.

Additionally, since each resilient contact portion 43 is resiliently deformed when the pair of contact portions 31A of each plug-side metal fixing member 28 come into contact with the pair of resilient contact portions 43 of the associated receptacle-side metal fixing member 37, the contact state between each contact portion 31A and the associated resilient contact portion 43 is maintained even when the plug connector 15 slightly moves in the receptacle connector 35. Furthermore, since the rigidity of the outer peripheral wall 52 and the rigidity of each lengthwise tail portion 41 are high (compared with the case where mounting holes, etc., into which the pair of receptacle-side metal fixing members are press-fitted, are formed in the receptacle insulator or the case where through-holes, positioned directly below the left and right pair of receptacle-side metal fixing members 37, are formed in the bottom plate portion of the receptacle insulator), reduction in contact pressure of each resilient contact portion 43 against the associated contact portion 31A can be suppressed compared with the case where mounting holes, etc., into which the pair of receptacle-side metal fixing members are press-fitted, are formed in the receptacle insulator or the case where through-holes, positioned directly below the left and right pair of receptacle-side metal fixing members 37, are formed in the bottom plate portion of the receptacle insulator.

Although the present invention has been described based on each of the above illustrated embodiments, the present invention is not limited solely to these particular embodiments; various modifications to the above illustrated embodiments are possible.

Figure 17:
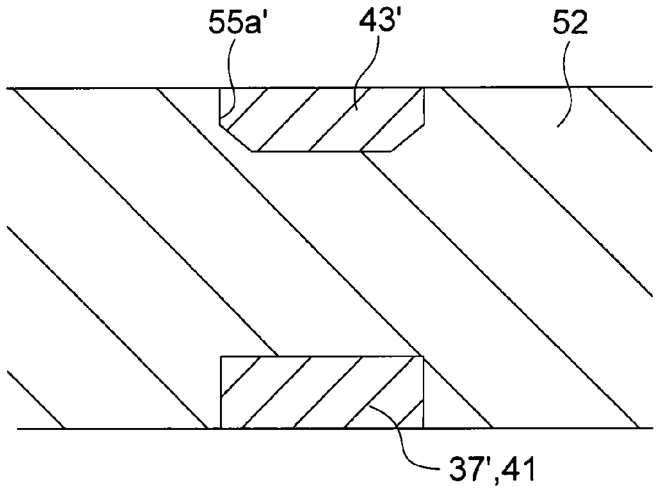
FIG. 17 is a view similar to that of FIG. 13, showing a first modified embodiment of the receptacle connector.
Figure 18:
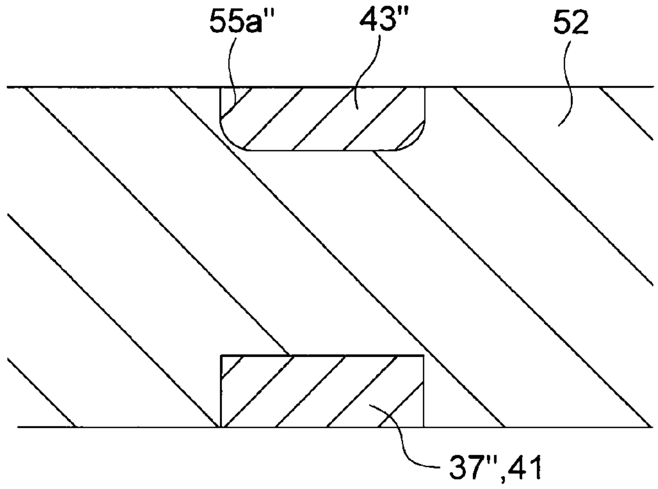
FIG. 18 is a view similar to that of FIG. 13, showing a second modified embodiment of the receptacle connector.
Figure 19:
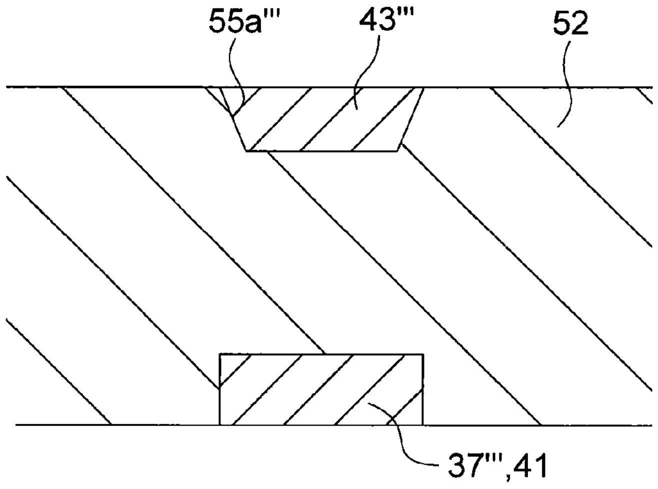
FIG. 19 is a view similar to that of FIG. 13, showing a third modified embodiment of the receptacle connector.

For instance, each resilient contact portion 43 of each receptacle-side metal fixing member 37 can be modified in cross sectional shape into a resilient contact portion 43' of a receptacle-side metal fixing member 37' shown in FIG. 17, a resilient contact portion 43" of a receptacle-side metal fixing member 37" shown in FIG. 18, or a resilient contact portion 43'" of a receptacle-side metal fixing member 37'" shown in FIG. 19. Each of the resilient contact portions 43', 43" and 43'" has a shape allowing the resilient contact portions 43', 43" and 43'" of the receptacle-side metal fixing member 37', 37" or 37'" to be deformed smoothly and easily to return to its free state (in other words, has a shape to be easily separated from the inner surface of an associated accommodating recess 55*a'*, 55*a"* or 55*a'"*). Accordingly, even if the viscosity of the synthetic resin material of the receptacle insulator 50 is somewhat high, each of the resilient contact portions 43', 43" and 43'" can be easily made to return to its free state (can be easily separated from the inner surface of the accommodating recess 55*a'*, 55*a"* or 55*a'"*).

Additionally, both the left and right end surfaces of each resilient contact portion 43,43', 43" and 43'" can be formed into a flat and smooth surface (or a substantially flat and smooth surface) by shaving after being formed into a rough flat surface when each receptacle-side metal fixing member 37,37', 37" and 37'" is formed by press-forming. This makes each resilient contact portion 43,43', 43" and 43'" easy to return to its free state (easy separate from the inner surface of an associated accommodating recess 55*a*, 55*a'*, 55*a"* or 55*a'"*) when the lower molding die DM and the upper molding die UM are opened after the completion of the insert molding.

Figure 20:
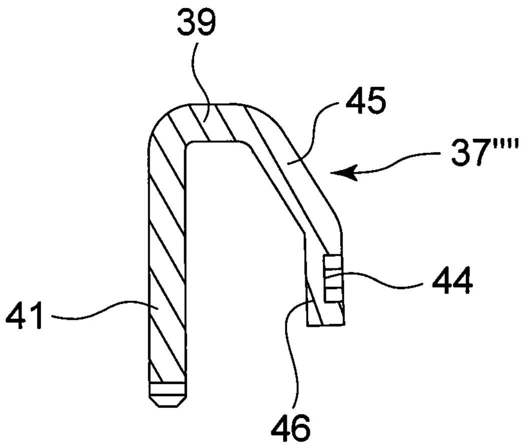
FIG. 20 is a side elevational view of a receptacle-side metal fixing member of a fourth modified embodiment of the receptacle connector.

A receptacle-side metal fixing member 37"" shown in FIG. 20 can be adopted instead of each receptacle-side metal fixing member 37, 37', 37" and 37'". The receptacle-side metal fixing member 37"" shown in FIG. 20 is provided with a pair of inclined portions 45 (only one of which is shown in FIG. 20) and a pair of downward-extending portions 46 (only one of which is shown in FIG. 20) instead of the pair of resilient contact portions 43, 43', 43" and 43'" and the pair of lengthwise tail portions 41, respectively. Each inclined portion 45 extends, in a free state, obliquely downward from the opposite end of the lengthwise fixing portion 39 from that of the lengthwise tail portion 41, and each downward-extending portion 46 extends, in a free state, downward from the lower end of the associated inclined portion 45. A lock recess 44 is formed on the surface of each downward-extending portion 46.

In the case where the receptacle-side metal fixing member 37"" is employed, the same functional effects as those of the above-described embodiments can also be exhibited.

Figure 21:
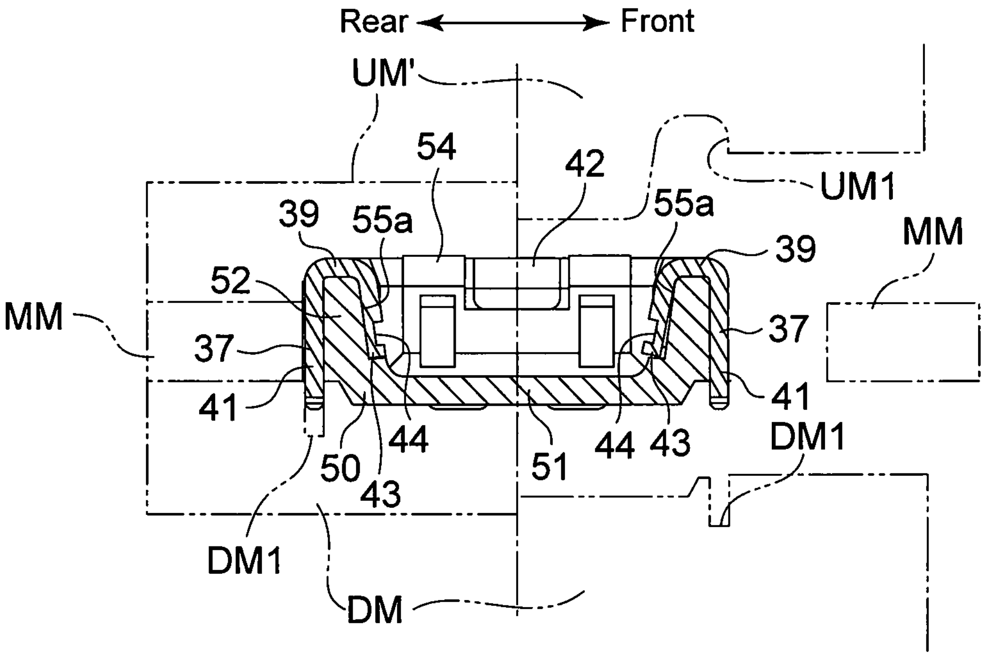
FIG. 21 is a view similar to that of FIG. 12, showing a fifth modified embodiment of the receptacle connector.

The modified embodiment of a set of forming dies shown by two-dot chain lines in FIG. 21 is provided with an upper molding die UM', a front and rear pair of middle molding dies MM and a lower molding die DM. The upper molding die UM' is partly different in shape from the upper molding die UM. Specifically, a portion of the upper molding die UM' on the circumferentially outer side of the pair of receptacle-side metal fixing members 37 is smaller in height than that of the upper molding die UM (see FIGS. 12 and 21).

In the case where an integrated body of the pair of receptacle-side metal fixing members 37 and the receptacle insulator 50 is formed by insert molding using this set of forming dies, the front and rear pair of middle molding dies MM which are placed on both the front and rear sides of the pair of receptacle-side metal fixing members 37 are brought toward each other, while the upper molding die UM' and the lower molding die DM are brought toward each other to sandwich the pair of middle molding dies MM (while making the lower and upper surfaces of the upper molding die UM' and the lower molding die DM press against the upper and lower surfaces of the pair of middle molding dies MM, respectively) with the front and rear pair of middle molding dies MM remaining in contact with front and rear outer surfaces the pair of receptacle-side metal fixing members 37. Upon completion of the insert molding, the upper molding die UM' and the lower molding die DM are separated from each other in the vertical direction while the front and rear pair of middle molding dies MM are separated from each other in the forward/rearward direction to open the set of forming dies.

According to this modified embodiment also, a receptacle connector(s) identical to the above illustrated receptacle connector 35 can be produced.

The plug-side metal fixing members 28 can be omitted from the plug connector 15.

One of the plug connector 15 and the receptacle connector 35 can be connected, using a right angle (RA) connection, to the associated circuit board.

Circuit boards other than rigid boards (e.g., flexible printed circuit boards (FPCs)) can be connected to the plug connector 15 and the receptacle connector 35.

Obvious changes may be made in the specific embodiments of the present invention described herein, such modifications being within the spirit and scope of the invention claimed. It is indicated that all matter contained herein is illustrative and does not limit the scope of the present invention.

What is claimed is:

1. A receptacle connector comprising:

a receptacle insulator made of synthetic resin which includes an annular outer peripheral wall which defines a fitting recess on a circumferentially inner side of said annular outer peripheral wall;

a plurality of receptacle contacts which are mountable to a circuit pattern on a receptacle-side circuit board and supported by said receptacle insulator; and a receptacle-side metal fixing member which is mountable to said receptacle-side circuit board and supported by said receptacle insulator, wherein, when a projecting fitting portion of a plug insulator of a plug connector is fitted into said fitting recess of said receptacle insulator, a plurality of plug contacts of said plug connector, which are mountable to a circuit pattern on a plug-side circuit board and supported by said plug insulator, come into contact with said plurality of receptacle contacts, and said plug connector comes into contact with said receptacle-side metal fixing member, wherein said receptacle-side metal fixing member and said receptacle insulator are integrally formed by insert molding, wherein said receptacle-side metal fixing member comprises a resilient contact portion which is spaced from a surface of said outer peripheral wall on said circumferentially inner side thereof when said resilient contact portion is in a free state, wherein said outer peripheral wall comprises a pair of widthwise structural portions and a pair of lengthwise structural portions, said outer peripheral wall being rectangular in shape, wherein said receptacle-side metal fixing member comprises:

a widthwise fixing portion which is fixed to one of said pair of widthwise structural portions and extends along a direction of extension of said pair of widthwise structural portions, and a pair of lengthwise fixing portions which are fixed to one of said pair of lengthwise structural portions and extend in a lengthwise direction of said outer peripheral wall from opposite ends of said widthwise fixing portion, wherein a pair of said resilient contact portions extend from said pair of lengthwise structural portions, respectively, wherein said plug connector comprises a plug-side metal fixing member which is supported by said plug insulator, wherein said plug-side metal fixing member comes into contact with said one of said pair of widthwise structural portions and said pair of resilient contact portions of said receptacle-side metal fixing member when said projecting fitting portion of said plug insulator is fitted into said fitting recess of said receptacle insulator, wherein said projecting fitting portion of said plug insulator is annular in shape, wherein said receptacle insulator comprises an engaging protrusion which is positioned on said circumferentially inner side of said annular outer peripheral wall, wherein said engaging protrusion is engaged inside said annular projecting fitting portion of said plug insulator when said annular projecting fitting portion of said plug insulator is fitted into said fitting recess of said receptacle insulator, and wherein said engaging protrusion includes an inclined guide surface which comes into contact with said plug-side metal fixing member when said annular projecting fitting portion of said plug insulator is fitted into said fitting recess of said receptacle insulator.

2. A method of producing a receptacle connector including a receptacle insulator made of synthetic resin which includes an annular outer peripheral wall which defines a fitting recess on a circumferentially inner side of said annular outer peripheral wall; a plurality of receptacle contacts which are mountable to a circuit pattern on a receptacle-side circuit board and supported by said receptacle insulator; and a receptacle-side metal fixing member which is mountable to said receptacle-side circuit board and includes a fixing portion which is fixed to said receptacle insulator, wherein, when a projecting fitting portion of a plug insulator of a plug connector is fitted into said fitting recess of said receptacle insulator, a plurality of plug contacts of said plug connector which are mountable to a circuit pattern on a plug-side circuit board and supported by said plug insulator come into contact with said plurality of receptacle contacts, and said plug connector comes into contact with said receptacle-side metal fixing member, wherein said method of producing said receptacle connector comprises:

resiliently deforming a resilient contact portion which is formed on said receptacle-side metal fixing member toward a circumferentially outer side of said outer peripheral wall using molding dies;

integrating said fixing portion of said receptacle-side metal fixing member and said receptacle insulator by insert molding, wherein a shape of a surface of said outer peripheral wall on said circumferentially inner side thereof being defined by said resilient contact portion when said resilient contact portion is resiliently deformed; and separating said molding dies from said receptacle insulator and said receptacle-side metal fixing member to allow said resilient contact portion to resiliently return to a free state thereof, thereby disengaging said resilient contact portion from said surface of said outer peripheral wall.

* * * * *